United States Patent
Maekawa et al.

(10) Patent No.: US 9,564,485 B2
(45) Date of Patent: Feb. 7, 2017

(54) SWITCH DRIVING CIRCUIT, INVERTER APPARATUS AND POWER STEERING APPARATUS

(71) Applicants: Kabushiki Kaisha Toshiba, Minato-ku (JP); NSK Ltd., Shinagawa-ku (JP)

(72) Inventors: Sari Maekawa, Yokohama (JP); Shigeru Fukinuki, Tokyo (JP); Shin Kumagai, Tokyo (JP)

(73) Assignees: KABUSHIKI KAISHA TOSHIBA, Minato-ku (JP); NSK Ltd., Shinagawa-ku (JP)

( * ) Notice: Subject to any disclaimer, the term of this patent is extended or adjusted under 35 U.S.C. 154(b) by 0 days.

(21) Appl. No.: 14/200,858

(22) Filed: Mar. 7, 2014

(65) Prior Publication Data
US 2014/0184107 A1 Jul. 3, 2014

Related U.S. Application Data

(63) Continuation of application No. PCT/JP2012/070504, filed on Aug. 10, 2012.

(30) Foreign Application Priority Data

Sep. 7, 2011 (JP) ................................. 2011-195051

(51) Int. Cl.
*H02P 6/14* (2016.01)
*H01L 29/00* (2006.01)
(Continued)

(52) U.S. Cl.
CPC ............. *H01L 29/00* (2013.01); *H02J 7/0034* (2013.01); *H02M 7/48* (2013.01);
(Continued)

(58) Field of Classification Search
USPC ...................................................... 318/400.26
See application file for complete search history.

(56) References Cited

U.S. PATENT DOCUMENTS 6,147,923 A 11/2000 Nakano
7,268,508 B2 9/2007 Caillaud et al.
(Continued)

FOREIGN PATENT DOCUMENTS

CN 200983560 Y 11/2007
CN 102150359 A 8/2011
(Continued)

OTHER PUBLICATIONS

International Search Report with English Translation mailed on Nov. 13, 2012 for PCT/JP2012/070504 filed on Aug. 10, 2012.
(Continued)

*Primary Examiner* — Eduardo Colon Santana
*Assistant Examiner* — Bickey Dhakal
(74) *Attorney, Agent, or Firm* — Oblon, McClelland, Maier & Neustadt, L.L.P.

(57) ABSTRACT

A switch driving circuit electrically opens and closes a switch circuit including two N-channel type semiconductor switching elements series connected in a reverse direction, thereby electrically opening and closing a path between a DC power supply and an inverter circuit. The switch driving circuit has a reference potential point in common with the inverter circuit and supplies an opening/closing control signal to the switch circuit. The switch driving circuit includes a half bridge circuit including two semiconductor switching elements series connected between a driving power supply and the reference potential point. Two protection diodes are connected in parallel to the semiconductor switching elements respectively. At least one current blocking diode is configured to block current from flowing from
(Continued)

the reference potential point through the diode to the switch circuit side when the DC power supply is connected to the inverter circuit in reverse polarity.

4 Claims, 8 Drawing Sheets

(51) Int. Cl.
 *H02M 7/48* (2007.01)
 *H02J 7/00* (2006.01)
 *H02M 7/5387* (2007.01)
 *H02P 27/06* (2006.01)
 *H02P 29/02* (2016.01)

(52) U.S. Cl.
 CPC ........ *H02M 7/53871* (2013.01); *H02P 27/06* (2013.01); *H02P 29/027* (2013.01); *Y10T 307/76* (2015.04)

(56) References Cited

U.S. PATENT DOCUMENTS

| | | | |
|---|---|---|---|
| 2011/0026179 A1* | 2/2011 | Kasper | H02H 9/042 361/91.5 |
| 2014/0184107 A1* | 7/2014 | Maekawa | H02M 7/48 318/14 |

FOREIGN PATENT DOCUMENTS

| | | | |
|---|---|---|---|
| DE | 38 35 662 A1 | 4/1990 | |
| DE | 10 2004 007 991 A1 | 9/2005 | |
| EP | 2 182 629 A2 | 5/2010 | |
| EP | 2 182 629 A3 | 5/2010 | |
| IL | WO 0161818 A1 * | 8/2001 | ............ H02H 3/087 |
| JP | 10-167085 A | 6/1998 | |
| JP | 2004-168124 A | 6/2004 | |
| JP | 2009-274686 A | 11/2009 | |
| JP | 2010-259245 A | 11/2010 | |
| WO | WO 01/61818 A1 | 8/2001 | |

OTHER PUBLICATIONS

Combined Office Action and Search Report issued on Dec. 30, 2015 in Chinese Patent Application No. 201280041766.3 with partial English and English translation of category of cited documents.

Extended European Search Report issued on Apr. 29, 2016 in Patent Application No. 12830399.7.

Office Action issued on May 27, 2016 in Korean Patent Application No. 10-2014-7008758 (with English language translation).

Combined Chinese Notification of Opinion on Examination and Search Report issued May 5, 2015 in Patent Application No. 201280041766.3 (with English language translation and English translation of categories of cited documents).

* cited by examiner

SWITCH DRIVING CIRCUIT, INVERTER APPARATUS AND POWER STEERING APPARATUS

CROSS-REFERENCE TO RELATED APPLICATIONS

This application is based upon and claims the benefit of priority from the prior Japanese Patent Application No. 2011-195051 filed on Sep. 7, 2011 and the prior PCT International Application No. PCT/JP2012/70504 filed on Aug. 10, 2012, the entire contents of both of which are incorporated herein by reference.

FIELD

Embodiments described herein relate to a switch driving circuit which supplies an opening/closing control signal to a switch circuit electrically opening and closing an electrical path between a DC power supply and an inverter circuit, an inverter apparatus including the inverter circuit and the switch driving circuit, and a power steering apparatus including the inverter apparatus.

BACKGROUND

An electrically driven power steering apparatus includes a steering torque sensor detecting steering input torque supplied via a steering wheel by driver's operation and a control device determining a magnitude and a direction of motor output based on an output signal of the steering torque sensor. An electric motor is driven via an inverter circuit on the basis of the determination of the control device. Motor power is transmitted to a steering system, so that steering torque is reduced.

In conventional electrically driven power steering apparatuses, a switch composed of a relay is inserted between a battery serving as a power source and an inverter circuit. When detecting an overcurrent state or a defect of PWM control, a control device opens the switch to cut off power supply to the inverter circuit and the motor, thereby preventing generation of undesired assisting steering force by the motor. However, the switch configured of the relay is required to supply to the motor a large current ranging from several tens A to 100 A in order that steering assistance torque may be generated. A relay which can open and close a path along which the large current flows is large-sized. In view of the problem, a switch circuit has been proposed for use instead of the relay. The proposed switch circuit uses a semiconductor switching element such as a field-effect transistor (FET).

FIG. 6 shows an example of configuration conceived in the above-described case. An inverter circuit 1 includes six power metal-oxide semiconductor field-effect transistors (power MOSFETs) 2U to 2W and 2X to 2Z (N channel) configured into a three-phase bridge arrangement. The motor 3 includes three-phase windings (not shown) connected to three-phase output terminals of the inverter circuit. The motor 3 is a brushless DC motor, for example. A vehicle battery 4 has a positive terminal connected via a switch circuit 5 to a positive DC bus bar of the inverter circuit and a negative terminal (body earth) to a negative DC bus bar.

The switch circuit 5 includes two N-channel MOSFETs 6a and 6b connected via a common source to each other. The N-channel MOSFET 6a has a drain connected to a positive terminal of the battery 4, and the N-channel MOSFET 6b has a drain connected to a positive DC bus bar of the inverter circuit 1. Both N-channel MOSFETs have respective gates connected in common with a resistive element 7 which is further connected between the gates and sources of the MOSFETs.

A drive circuit 8 driving the switch circuit 5 is configured as a peripheral circuit such as a micro control unit (MCU; and microcomputer) which is an IC controlling the inverter circuit 1. Electrical power is supplied from the battery 4 via a diode 15. A circuit ground is connected to a negative DC bus bar of the inverter circuit 1. A power generation circuit 9 generating driving power to drive the switch circuit 5 has an output terminal. A series circuit of two N-channel MOSFETs 10 and 11 is connected between the output terminal of the power generation circuit 9 and the ground. These FETs 10 and 11 have respective gates. A drive signal supplied from the MCU is further supplied via a half-bridge (H/B) drive circuit 12 to the gates of the FETs 10 and 11 individually. Protecting diodes 13 and 14 are connected in parallel to the N-channel MOSFETs 10 and 11 respectively.

The MOSFETs 10 and 11 have common connection points (source and drain) connected to the gates of the N-channel MOSFETs 6a and 6b respectively. When the switch circuit 5 is turned on according to a drive signal from the MCU, the H/B drive circuit 12 turns on the N-channel MOSFET 10 and turns off the N-channel MOSFET 11, thereby turning gate potentials of the N-channel MOSFETs 6a and 6b to a high level. Furthermore, when the switch circuit 5 is turned off, the N-channel MOSFET 10 is turned off and the N-channel MOSFET 11 is turned on, so that the gate potentials of the N-channel MOSFETs 6a and 6b are turned to a low level.

Thus, with respect to a device mounted on a vehicle and supplied with power from the battery 4, it needs to be considered whether or not the circuit is protected when the battery 4 is connected in the reverse direction. Assume now the case where the battery 4 is connected in the reverse direction in the configuration shown in FIG. 6. The following problem arises in this case. As shown in FIG. 7, since the electric potential at the negative DC bus bar of the inverter circuit 1 rises, voltage is applied via the following path:

the positive terminal of the battery 4—the negative DC bus bar—the diode 14 (or the body diode of FET 11)—the switch circuit 5 (the gate-drain of FET 6a)—the negative terminal of the battery 4.

As a result, potential difference exceeding a threshold is applied to the path between the gate and the source of the FET 6 of the switch circuit 5, so that the switch circuit 5 is turned on thereby to cause electric current to flow along the above-mentioned voltage application path. Simultaneously, when the FET 6b side is turned on, current also flows through body diodes of the FETs 2U and 2X composing the inverter circuit 1. In this case, there is a possibility that the elements constituting the path may be broken by a short-circuit current flowing through the battery 4.

It is considered that the switch circuit 5 is connected with a P-channel MOSFET 16 being used as one of switching elements so that parasitic diodes have a common anode, as shown in FIG. 8. This connecting manner does not result in a problem of the above-described reverse flow. However, the P-channel MOSFET has a larger element size as compared with an N-channel MOSFET. Furthermore, the FETs need to be supplied with gate signals with different levels for purpose of control. Accordingly, the switch circuit is generally configured of two N-channel FETs. This necessitates the overcoming of the above-described problem.

DETAILED DESCRIPTION

In general, according to one embodiment, a switch driving circuit electrically opens and closes a switch circuit including two N-channel type semiconductor switching elements series connected in opposite directions, thereby electrically opening and closing an electrical path between a DC power supply and an inverter circuit. The switch driving circuit has a reference potential point in common with the inverter circuit and supplying an opening/closing control signal to the switch circuit. The switch driving circuit includes a half bridge circuit including two semiconductor switching elements series connected between a driving power supply and the reference potential point. Two protection diodes are connected in parallel to the semiconductor switching elements respectively. At least one current blocking diode is configured to block current from flowing from the reference potential point therethrough to the switch circuit side when the DC power supply is connected to the inverter circuit in reverse polarity.

Figure 1:
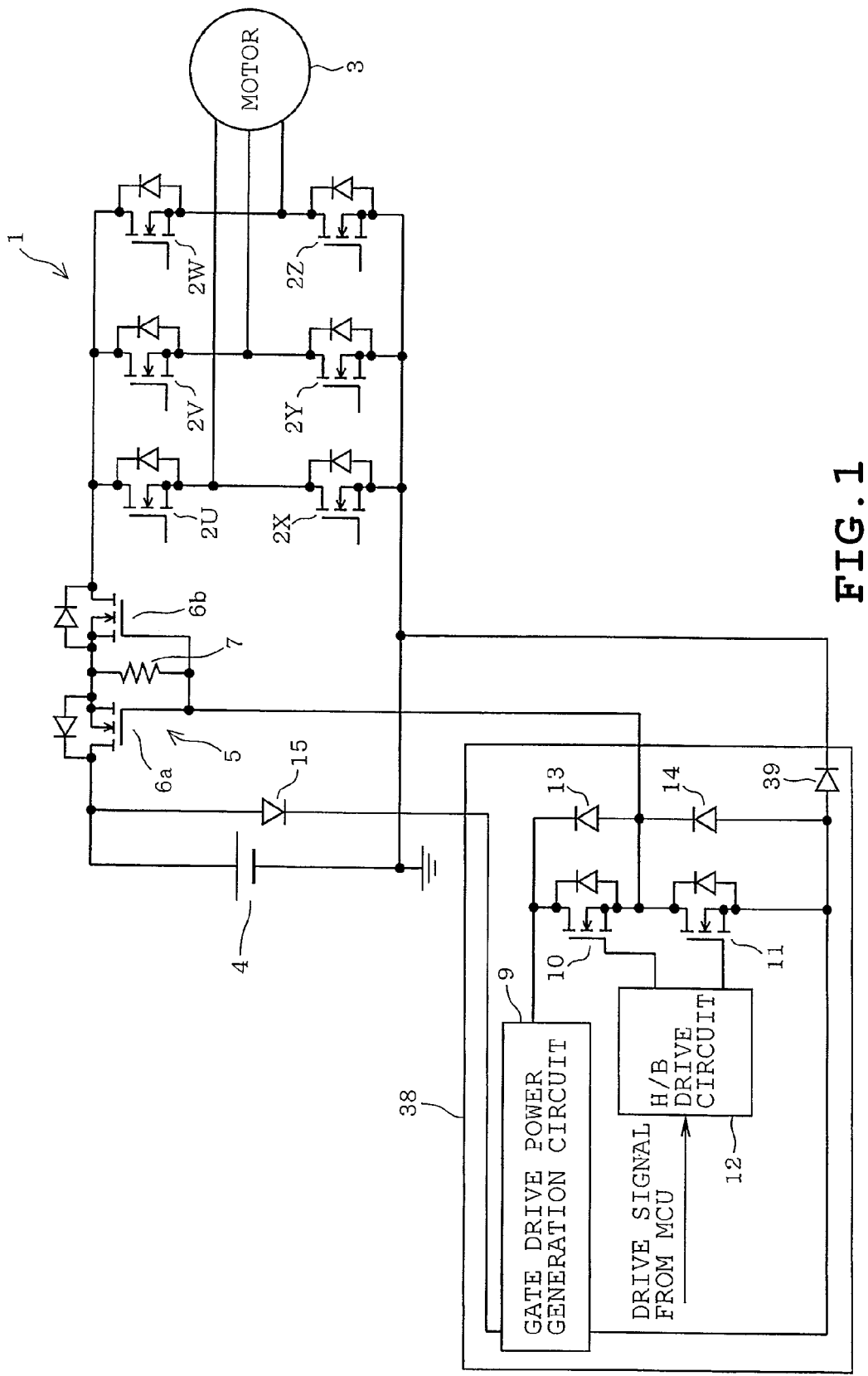
FIG. 1 is a circuit diagram showing an internal configuration of the switch driving circuit in accordance with a first embodiment.
Figure 2:
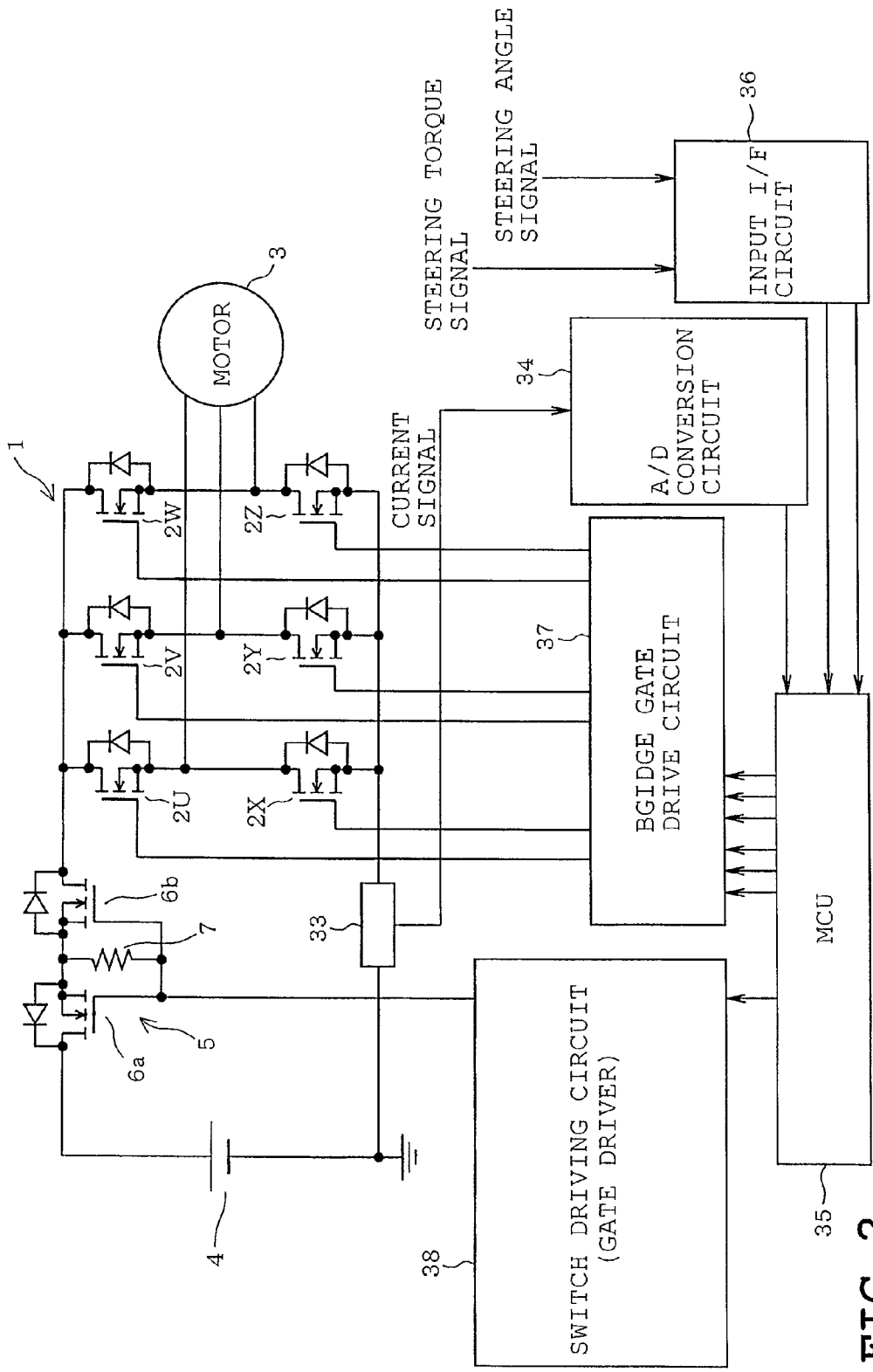
FIG. 2 is a functional block diagram showing an internal configuration of a motor drive control.
Figure 3:
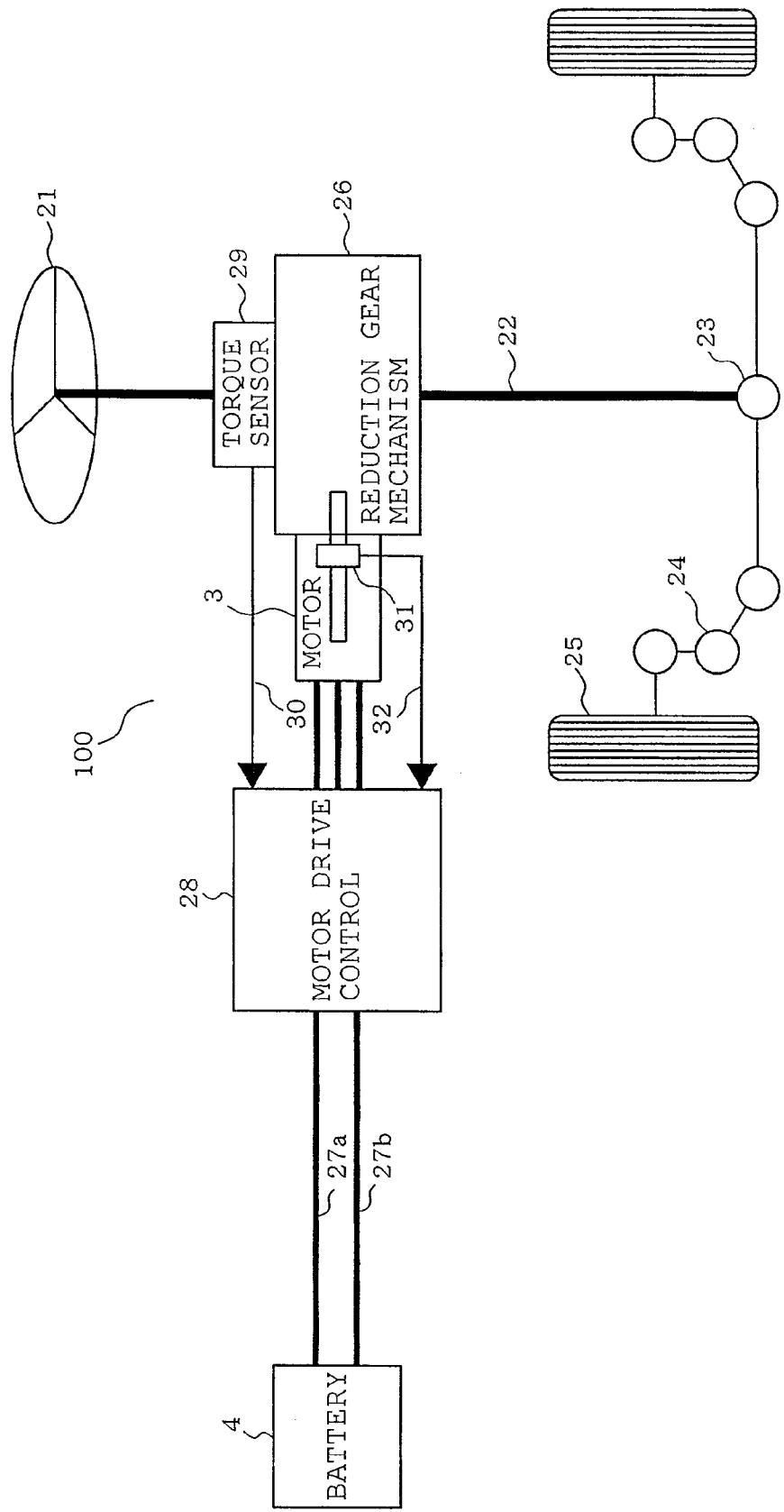
FIG. 3 is a schematic illustration of an entire power steering apparatus.

A first embodiment will be described with reference to FIGS. 1 to 3. Identical or similar parts in FIGS. 1 to 3 are labeled by the same reference symbols as those in FIG. 6. The description of these identical parts will be eliminated and only the differences will be described.

Referring first to FIG. 3, an entire construction of a power steering apparatus 100 is schematically shown. A steering shaft 22 has one end fixed to a steering handle 21 provided in passenger's compartment of a vehicle. A rotative force of the steering shaft 21 is transmitted by a rack and pinion mechanism 23 as a force changing a direction of wheels 25 mounted via coupling mechanisms on both ends of a rack shaft respectively. A three-phase brushless DC motor 3 assisting the rotative force is provided on the steering shaft 22. The motor 3 and the steering shaft 22 are coupled with each other via a reduction gear mechanism 26.

Power supply voltage of a battery 4 is supplied through wirings 27a and 27b to a motor drive control 28 which is provided so as to be adjacent or adherent to vicinity of the motor 3. The motor drive control 28 controls energization of the motor 3 in a pulse-width-modulation (PWM) manner. Battery voltage as a control power supply is supplied via a wiring 27 to the motor drive control 28. To the motor drive control 28 are connected a signal line 30 of a torque sensor 29 detecting torque applied to the steering shaft 22 and a signal line 32 of a resolver 31 detecting a rotation position of the motor 3.

FIG. 2 is a functional block diagram showing an internal configuration of the motor drive control 28. A current detector 33 (a resistive element, for example) is connected between a negative terminal (a reference potential point) of the battery 4 and a negative DC bus bar of an inverter circuit 1. A current signal obtained by the current detector 33 is supplied to an A/D conversion circuit 34. The current detector 33 may include a current probe which detects magnetic field generated by current thereby to detect current. The A/D conversion circuit 34 executes an analog-to-digital conversion of the current signal supplied thereto, supplying obtained data to the MCU 35.

An input interface (I/F) circuit 36 is supplied with a steering angle signal from the torque sensor 29 and a steering angle signal from the resolver 31. The input I/F circuit 36 supplies voltage signals according to the respective input signals to the MCU 35. The MCU 35 is configured of a microcomputer or the like and generates gate signals for control of the FETs 2 constituting the inverter circuit 1 according to the input signals, supplying the gate signals to a bridge gate drive circuit 37. The MCU 35 also supplies a drive signal via a switch drive signal 38 to the switch circuit 5. Power is supplied from the battery 4 to the above-described circuits when a vehicle ignition switch (not shown) is turned on.

When supplied with power, the MCU 35 firstly supplies a cutoff command (OFF) signal to the switch circuit 5. Upon completion of an initialization process therefor, the MCU 35 then supplies a closing (ON) signal to the switch circuit 5. As a result, power of the battery 4 is supplied to the inverter circuit 1. The MCU 35 fetches a steering torque signal and a steering rotating speed to determine whether or not a steering assisting force (torque) needs to be supplied from the motor 3. When the steering assisting force needs to be supplied, the MCU 35 obtains a rotation direction of the motor 3 and a steering assisting force to be supplied from the motor 3 based on the steering speed. The MCU 35 generates and supplies a gate drive control signal based on the obtained rotation direction and the steering assisting force. The MCU 35 further supplies a cutoff command signal to the switch circuit 5 when the current value detected by the current detector 33 exceeds an overcurrent value.

The bridge gate drive circuit 37 includes a booster circuit which generates a gate supply voltage to control the FETs 2U to 2W at an upper arm side constituting the inverter circuit 1 so that the FETs 2U to 2W are turned into a conductive state. The bridge gate drive circuit 37 also includes a plurality of level shift circuits (none of them being shown). The gate drive circuit 37 supplies gate voltage signals to gates of the FETs 2U to 2W based on a gate drive control signal supplied thereto from the MCU 35. The MCU 35 monitors current flowing in the inverter circuit 1 based on current signals. When the current flowing in the inverter circuit 1 exceeds a previously set allowable current, the NCU 35 stops drive of the motor 3 and cuts off energization of the switch circuit 5 thereby to cut off power supply to the inverter circuit 1.

Figure 6:
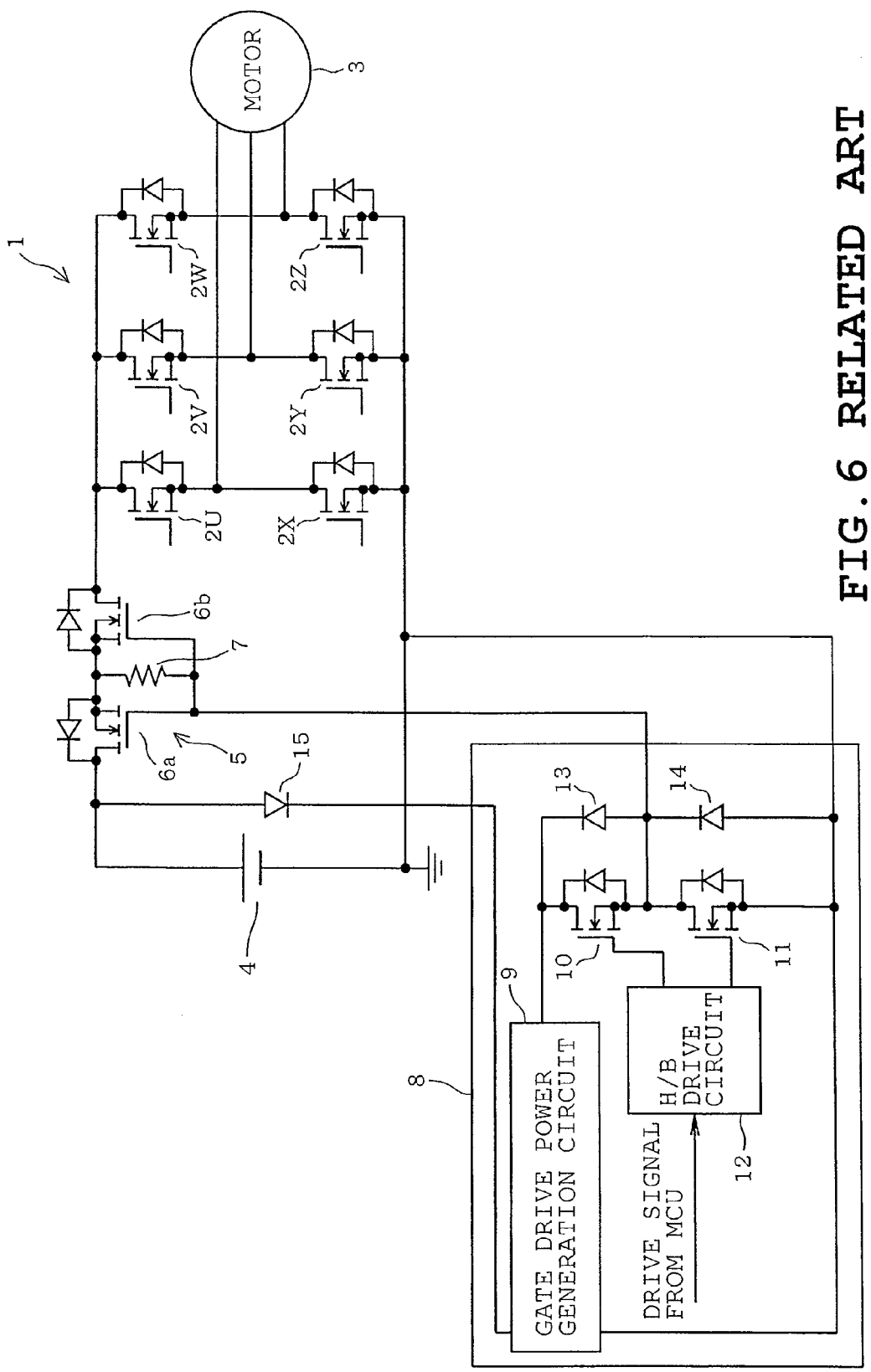
FIG. 6 is a view similar to FIG. 1, showing a related art.
Figure 7:
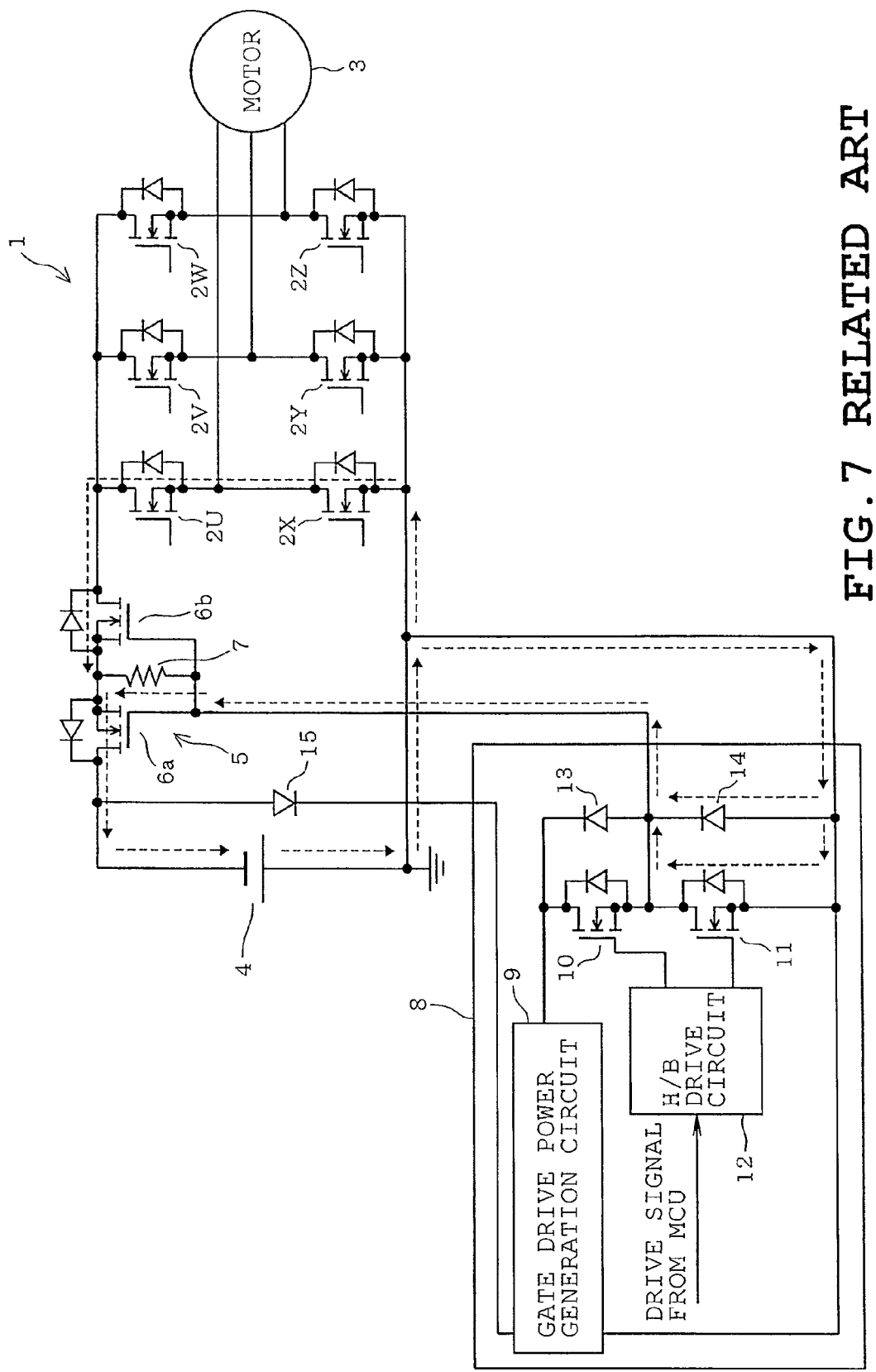
FIG. 7 is a view similar to FIG. 6, showing the case where the battery is connected so as to have a reverse polarity.
Figure 8:
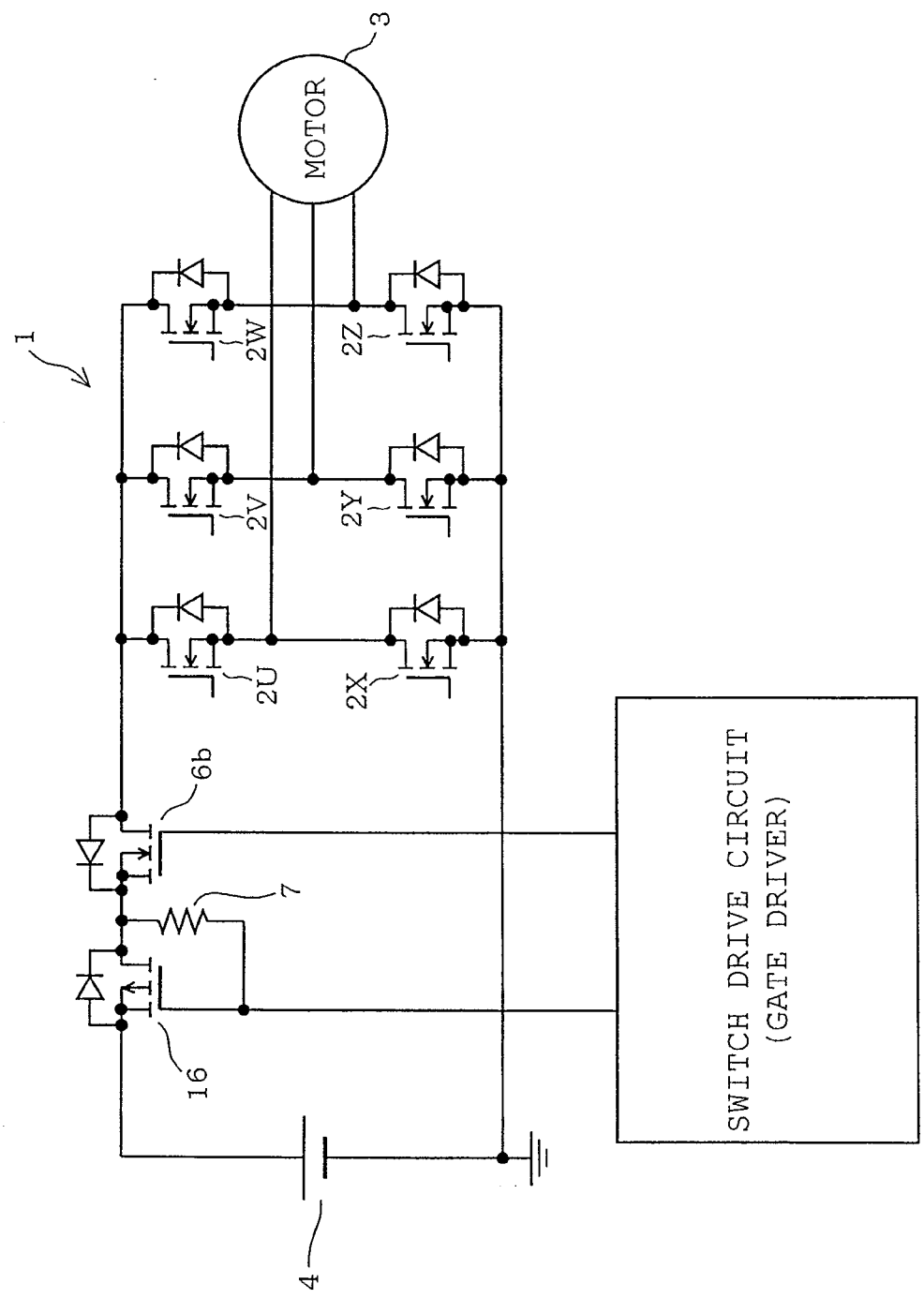
FIG. 8 is a view similar to FIG. 6, showing the case where the switch is composed of P-channel MOSFETs.

FIG. 1 is a view similar to FIG. 6, showing an internal configuration of the switch driving circuit 38. A ground of the circuit 8 as shown in FIG. 6 is directly connected to the negative DC bus bar of the inverter circuit 1. In the switch driving circuit 38 of the embodiment, however, a forward-biased diode 39 (a current element diode) is inserted between the circuit 38 and the circuit ground thereof. Consequently, an overcurrent can be prevented from flowing through the parasitic diodes of the FETs 2U-2W and 2X-2Z even when the battery 4 is connected in reverse polarity as shown in FIG. 7.

According to the above-described embodiment, the switch driving circuit 38 electrically opens and closes the switch circuit 5 including two N-channel MOSFETs 6a and 6b (N-channel type semiconductor switching elements) series connected in opposite directions, thereby electrically opening and closing an electrical path between the battery 4 and the inverter circuit 1. The switch driving circuit has the reference potential point in common with the inverter circuit 1 and supplies the opening/closing control signal to the switch circuit 5. The switch driving circuit 38 includes the half bridge circuit including two N-channel MOSFETs 10 and 11 (semiconductor switching elements) series connected between the power supply generation circuit 9 and the reference potential point. Two protection diodes 13 and 14 are connected in parallel to the FETs 10 and 11 respectively. The switch driving circuit 38 includes the diode 39 which is configured to block current from flowing from the reference potential point therethrough to the switching circuit 5 side when the battery 4 is connected to the inverter circuit 1 in reverse polarity.

Accordingly, the switch circuit 5 can be rendered smaller in size as compared with high-power relays with the result that size reduction can be achieved in the power steering apparatus 100. Furthermore, even when the battery 4 is connected in reverse polarity, the parasitic diodes of the FETs 2U-2W and 2X-2Z and the protection diode 14 in the switch driving circuit 38 can prevent reverse current from flowing thereby to protect the inverter circuit 1 and the motor 3, with the result that short-circuit fault can be prevented.

Figure 4:
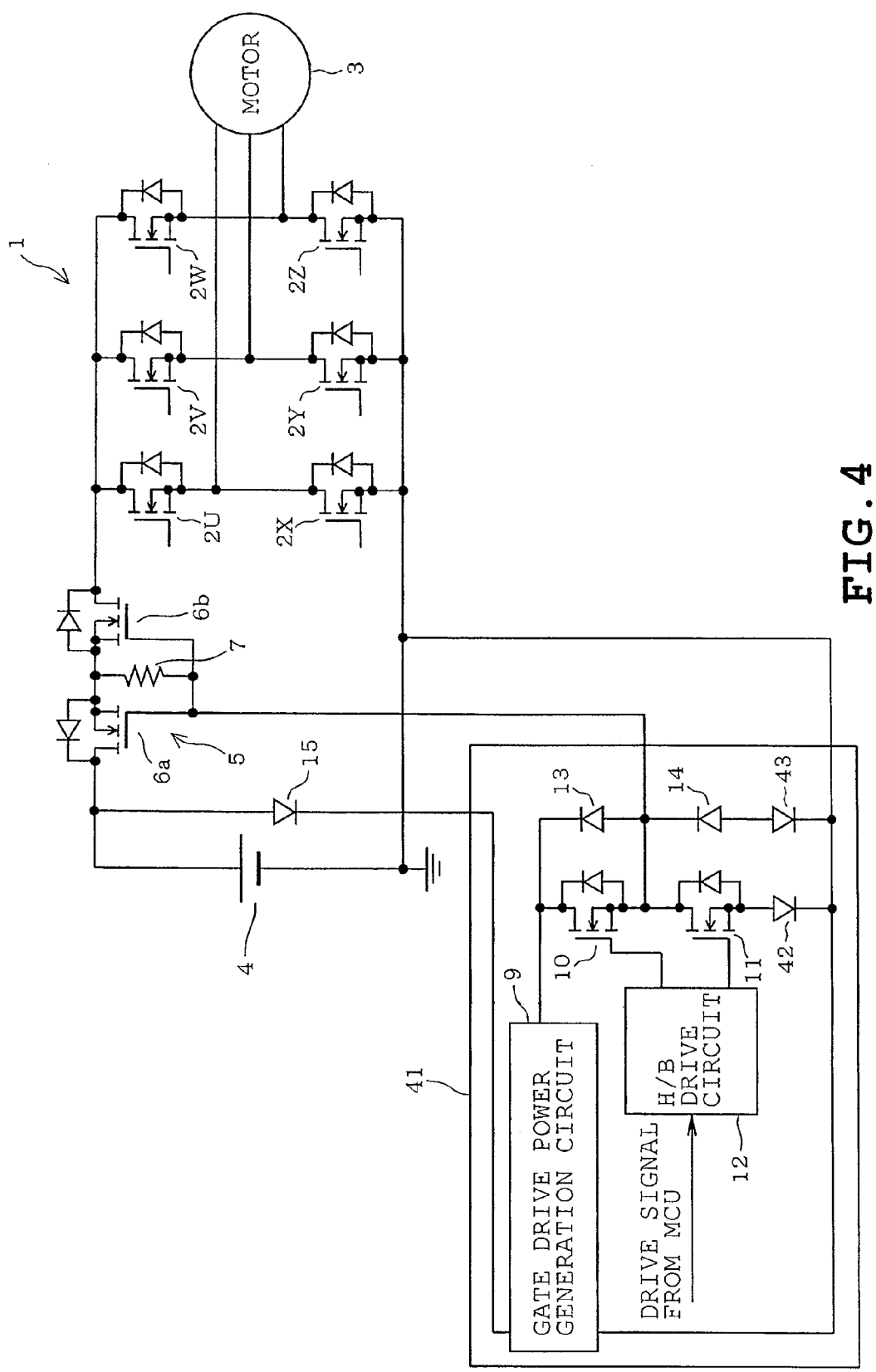
FIG. 4 is a view similar to FIG. 1, showing a second embodiment.

FIG. 4 illustrates a second embodiment. In the second embodiment, identical or similar parts to those of the first embodiment are labeled by the same reference symbols as those in the first embodiment and the description of these parts will be eliminated. Only the differences will be described in the following. The switch driving circuit 41 according to the second embodiment includes two current blocking diodes 42 and 43 connected between a source of the N-channel MOSFET 11 and the circuit ground and between an anode of the protection diode 14 and the circuit ground respectively, instead of the diode 39. This configuration of the second embodiment can also achieve the same advantageous effect as the first embodiment.

Figure 5:
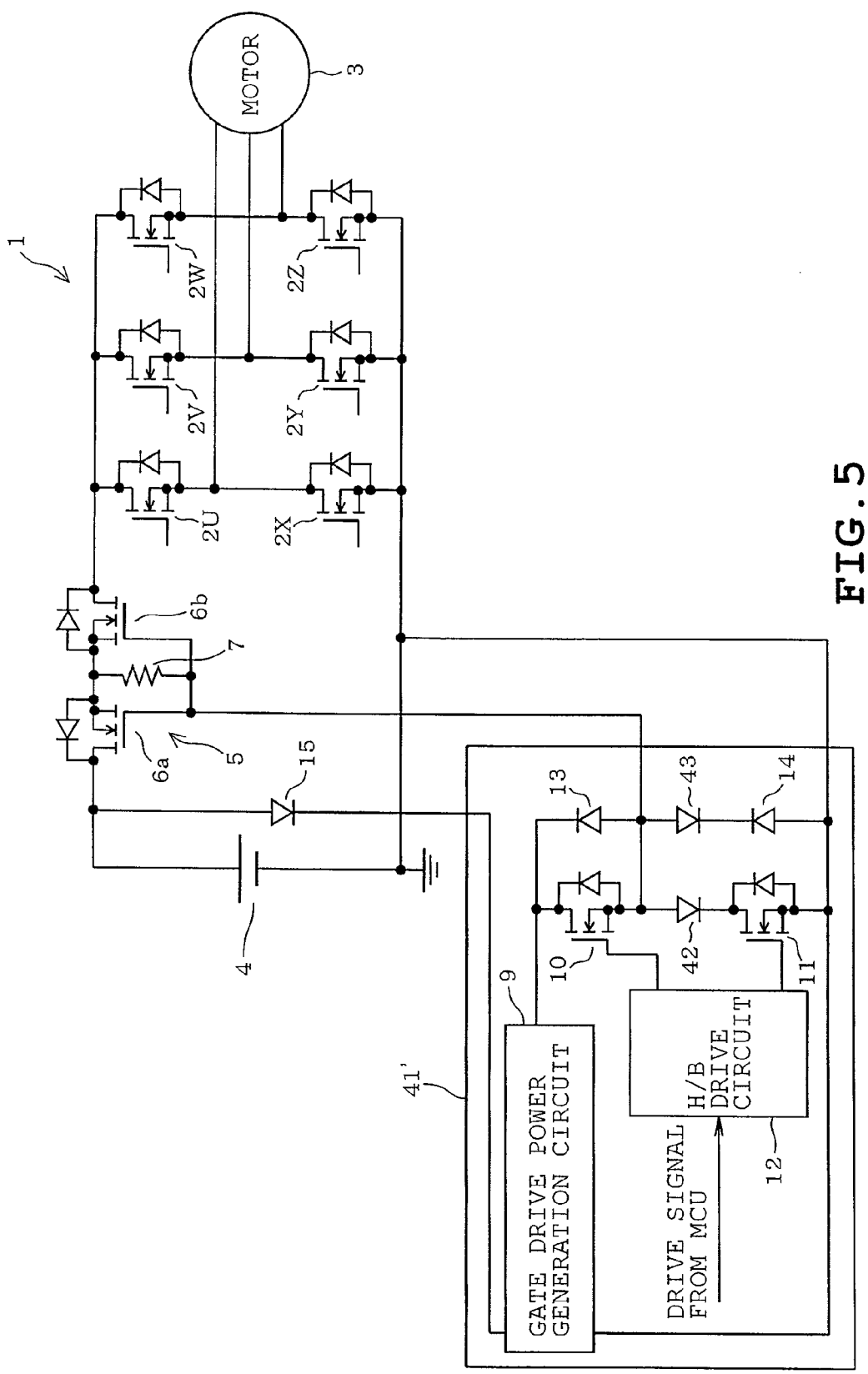
FIG. 5 is a view similar to FIG. 1, showing a third embodiment.

FIG. 5 illustrates a third embodiment. The differences between the second and third embodiments will be described. The switch driving circuit 41' according to the third embodiment includes the current blocking diodes 42 and 43 employed in the second embodiment. In the third embodiment, the diodes 42 and 43 are connected between the source of the N-channel MOSFET 10 and a drain of the N-channel MOSFET 11 and between an anode of the protection diode 13 and a cathode of the protection diode 14. This configuration of the third embodiment can also achieve the same advantageous effect as the first and second embodiments.

In a modified form, a P-channel MOSFET may be used in each foregoing embodiment, instead of the N-channel MOSFET 10. Furthermore, P-channel MOSFETs may be used for an upper arm of the inverter circuit 1 in each foregoing embodiment.

The switch driving circuit should not be limited to the use with the power steering apparatus but may be applied to any electrical equipment including a switch circuit configured of an N-channel type semiconductor switching element between the DC power supply and the inverter circuit.

While certain embodiments have been described, these embodiments have been presented by way of example only, and are not intended to limit the scope of the invention. Indeed, the novel embodiments described herein maybe embodied in a variety of other forms; furthermore, various omissions, substitutions and changes in the form of the embodiments described herein may be made without departing from the spirit of the invention. The accompanying claims and their equivalents are intended to cover such forms or modifications as would fall within the scope and spirit of the invention.

What is claimed is:

1. A switch driving circuit which electrically opens and closes a switch circuit including two N-channel type semiconductor switching elements series connected in opposite directions, thereby electrically opening and closing an electrical path between a DC power supply and an inverter circuit, the switch driving circuit having a reference potential point in common with the inverter circuit and supplying an opening/closing control signal to the switch circuit, the switch driving circuit comprising:
   a half bridge circuit including two semiconductor switching elements series connected between a driving power supply and the reference potential point;
   two protection diodes connected in parallel to the semiconductor switching elements respectively; and
   two current blocking diodes connected between a signal output terminal of the half bridge circuit and one of the semiconductor switching elements at the reference potential side and between the signal output terminal of the half bridge circuit and one of the protection diodes connected in parallel to the one semiconductor switching element respectively.

2. A power steering apparatus comprising:
   an electric motor generating an assistant steering force assisting a steering force of a vehicle steering; and
   the inverter apparatus claimed in claim 1 and controlling the motor.

3. An inverter apparatus comprising:
   an inverter circuit supplied with a DC power supply;
   a switch circuit electrically opening and closing an electrical path between the DC power supply and the inverter circuit; and
   a switch driving circuit having a reference potential point in common with the inverter circuit and supplying a signal controlling opening and closing of the switch circuit, wherein:
   the switch circuit includes two N-channel type semiconductor switching elements series connected in a reverse direction;
   the switch driving circuit includes a half bridge circuit including two semiconductor switching elements series connected between a driving power supply and the reference potential point; and further comprising
   two current blocking diodes connected between a signal output terminal of the half bridge circuit and one of the semiconductor switching elements at the reference potential side and between the signal output terminal of the half bridge circuit and a protection diode connected in parallel to the one semiconductor switching element respectively.

4. A power steering apparatus comprising:
   an electric motor generating an assistant steering force assisting a steering force of a vehicle steering; and the inverter apparatus claimed in claim 3 and controlling the motor.

* * * * *